United States Patent [19]

Iimura et al.

[11] Patent Number: 4,594,602

[45] Date of Patent: Jun. 10, 1986

[54] HIGH SPEED DIODE

[75] Inventors: Kenji Iimura, Hitachi; Yoichi Nakashima, Ibaraki, both of Japan

[73] Assignee: Hitachi, Ltd., Tokyo, Japan

[21] Appl. No.: 599,166

[22] Filed: Apr. 11, 1984

[30] Foreign Application Priority Data

Apr. 13, 1983 [JP] Japan .................. 58-66152

[51] Int. Cl.⁴ .................... H01L 29/91; H01L 29/167
[52] U.S. Cl. .................... 357/13; 357/15; 357/53; 357/64; 357/89; 357/90
[58] Field of Search .................. 357/15, 13, 53, 64, 357/90, 89

[56] References Cited

U.S. PATENT DOCUMENTS

| | | | |
|---|---|---|---|
| 3,675,091 | 7/1972 | Naomoto et al. | 357/53 |
| 3,964,084 | 6/1976 | Andrews et al. | 357/15 |
| 4,131,339 | 12/1978 | Dannhäuser et al. | 357/13 |
| 4,476,481 | 10/1984 | Iesaka et al. | 357/90 |

OTHER PUBLICATIONS

Sze, *Physics of Semiconductor Devices*, J. Wiley, 1981, N.Y., pp. 304–306.

*Primary Examiner*—Martin H. Edlow
*Assistant Examiner*—Jerome Jackson, Jr.
*Attorney, Agent, or Firm*—Antonelli, Terry & Wands

[57] ABSTRACT

A high-speed diode with a PNN+ structure has a breakdown voltage of about 200 V, a forward voltage drop of 0.9 V or less, a reverse recovery time of 50 nsec or less, and a soft recovery characteristic, by making the impurity concentration in the surface of a P-layer equal to or less than $8 \times 10^{18}$ atoms/cc, putting the thickness of the P-layer in a range from 2 to 6 $\mu$m, putting the resistivity of an N-layer in a range from 5 to 12$\Omega$-cm, putting the thickness of the N-layer in a range from 19 to 25 $\mu$m, and putting the carrier lifetime in the N-layer in a range from 20 to 40 nsec.

11 Claims, 5 Drawing Figures

HIGH SPEED DIODE

BACKGROUND OF THE INVENTION

The present invention relates to a diode which has a PNN+ structure and can operate at high speed.

Recently, there has been a strong trend to miniaturize various types of equipment and many of such power units included in the equipment have been changed from a conventional dropper type power source to a switching regulator. Further, the switching frequency of the regulator has been increased to 50 KHz or more, and a switching regulator having a frequency of 200 to 300 KHz will be put to practical use in the near future. In order to reduce switching loss, the switching regulator of this kind is required to include a high-speed diode which is short in reverse recovery time (trr) and small in forward voltage drop $V_F$. Further, in order to reduce switching noise in the regulator, a high-speed diode is required in which a reverse recovery current rises gently to exhibit the so-called soft recovery characteristic.

Presently available high-speed diodes which are suitable for use in such switching regulators are classified roughly in two groups from the structural point of view. One of the groups is a Schottky barrier diode for a low voltage source such as a 5-volt power source. The Schottky barrier diode is advantageous in that the reverse recovery time (trr) is tens of nanoseconds or less since no minority carriers are stored, and in that the forward voltage drop $V_F$ can be reduced to a value of 0.5 to 0.6 V by appropriately selecting the height of the Schottky barrier. However, this diode has a drawback that the breakdown voltage $V_R$ is low, that is, it lies in a range from 40 to 50 V. The other group is a high-speed diode with a PNN+ (PνN, PπN or PIN) structure for relatively high voltage sources such as a 12-volt power source and a 24-volt power source. This diode has a reduced capacitance and a breakdown voltage of 100 to 200 V due to the existence of a high resistivity region between the cathode and anode, but is found to have the following drawbacks. The forward voltage drop $V_F$ is relatively high, that is, about 1 V, and the reverse recovery time (trr) is hundreds of nanoseconds since minority carriers are stored. Further, the present inventors have found that the reverse recovery current rises abruptly, and considerable noise is produced in the packaged diode because of this. It is to be noted that the soft reverse recovery is a new subject which is recognized by the present inventors as being important The present invention is directed to attaining such a soft reverse recovery.

SUMMARY OF THE INVENTION

An object of the present invention is to provide a high-speed diode which is high in breakdown voltage, small in forward voltage drop, and low in noise in the packaged device.

Another object of the present invention is to provide a high-speed diode which has a breakdown voltage of about 200 V, a forward voltage drop of 0.9 V or less, a reverse recovery time of 50 nsec or less, and a soft reverse recovery characteristic.

In order to attain the above objects, according to the present invention, there is provided a high-speed diode which includes a semiconductor pellet having at least P−, N−, and N+-layers in the form of a PNN+ structure, and in which the N-layer has a thickness of 19 to 25 μm and a resistivity of 5Ω-cm or more, the carrier lifetime in the N-layer lies in a range from 20 to 40 nsec, the depth $x_j$ of a rectifying junction (namely, the thickness of the P-layer) lies in a range from 2 to 6 μm, and the impurity concentration in the surface of the P-layer is $8 \times 10^{18}$ atoms/cc or less. Incidentally, the N+-layer has the conductivity of N-type and is higher in impurity concentration than the N-layer.

BRIEF DESCRIPTION OF THE DRAWINGS

The present invention will become more apparent from the following detailed description taken in conjunction with the accompanying drawings, in which:

FIG. 4 also shows a relation between the impurity concentration in the surface of P-layer and the contact potential difference between an electrode and a semiconductor pellet.

DETAILED DESCRIPTION

Now, the present invention will be explained below in detail, on the basis of an embodiment thereof.

Figure 1A:
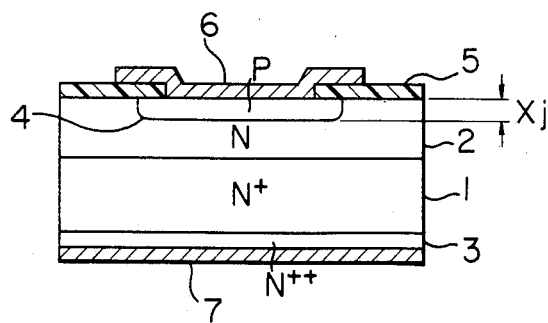
FIG. 1a is a longitudinal sectional view showing an embodiment of a high-speed diode according to the present invention.

FIG. 1a shows, in section, an embodiment of a high-speed diode according to the present invention. In order not to increase the forward voltage drop $V_F$ of the embodiment, an N+-silicon substrate 1 is used which is doped with antimony so as to have a low resistivity of 0.015Ω-cm. An N-layer 2 having a resistivity of 5 to 12Ω-cm is grown epitaxially on the substrate 1 to a thickness of 27 μm. The whole surface of the silicon wafer thus formed is oxidized to form an SiO$_2$ film 5. Then, the SiO$_2$ film on the bottom side of the silicon substrate 1 is removed, and an N++-silicon layer 3 is formed in the bottom surface of the substrate 1, to realize a low resistance ohmic contact with an electrode. The N++-layer 3 has the conductivity of N-type, and is higher in impurity concentration than the N+-silicon substrate 1. Then, the SiO$_2$ film 5 on the N-layer 2 is selectively removed by the well-known photolithography to provide apertures in the SiO$_2$ film 5, and boron is diffused into the N-layer 2 through the apertures to form a P-layer 4 having a depth of 5 μm. Accordingly, the P-layer 4 is surrounded with the N-layer 2 in the surface thereof, and a planar structure is formed. The silicon wafer thus treated is doped with a heavy metal capable of acting as a lift-time killer (for example, gold or platinum) so that the carrier lifetime is equal to 22 nsec. Thereafter, a field plate electrode 6 and a contact electrode 7 are formed, through evaporation techniques, on the upper and lower surfaces of the silicon wafer, respectively. Finally, the wafer thus produced is separated into individual diode pellets to obtain the devices shown in FIG. 1a.

Figure 1B:
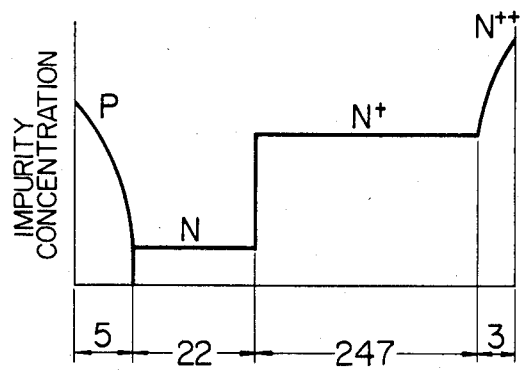
FIG. 1b is a graph showing the relation between depth and impurity concentration in the semiconductor pellet shown in FIG. 1.

FIG. 1b shows the variation of impurity concentration with depth in the silicon pellet shown in FIG. 1a. That is, the distance from the surface of the silicon pellet is plotted as abscissa, and the impurity concentration as ordinate. In FIG. 1b, numerical values written alongside the abscissa indicate the thickness of the silicon layers 1 to 4 in micrometers.

The field plate electrode 6 is made of aluminum or has a multi-layer structure such as Al-Cr-Ni-Ag, Cr-Ni-Ag, or Ti-Ni-Ag, and the contact electrode 7 has a multi-layer structure such as Cr-Ni-Ag or Ti-Ni-Ag. As shown in FIG. 1a, the field plate electrode 6 is extended on the $SiO_2$ film 5 so as to go beyond that end of a PN junction formed between the layers 2 and 4 which is exposed to the surface of the semiconductor pellet, the order to prevent a reduction in breakdown voltage due to the variation of the surface charge of the $SiO_2$ film 5 with time.

Figure 2:
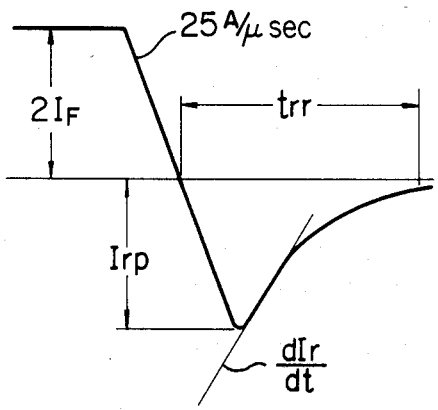
FIG. 2 is a graph showing the waveform of the reverse recovery current of a diode.

FIG. 2 shows a current waveform at a time when a high-speed diode of the present invention changes from a foward conductive state into a reverse blocking state. As shown in FIG. 2, the current characteristic of a high-speed diode can be expressed by a reverse recovery time (trr), a peak reverse current $I_{rp}$, and the time derivative of a reverse recovery current $dI_r/dt$ at the risetime thereof. In order to reduce switching loss, it is required to make short the reverse recovery time (trr) short and to make the peak reverse current $I_{rp}$ small. Further, in order to decrease noise ascribed to a switching regulator, it is required to make both of $I_{rp}$ and $dI_r/dt$ small, that is, the high-speed diode is required to have a soft recovery characteristic. In other words, it is desirable that the high-speed diode used in a switching regulator is small in each of three parameters trr, $I_{rp}$, and $dI_r/dt$. Specifically, when the parameter $dI_r/dt$ is made small to obtain a soft recovery characteristic, noise in the switching regulator is reduced. Accordingly, a snubber circuit coupled with the switching regulator can be made small in size, and thus a power unit in which such a switching regulator is used can be miniaturized.

Next, explanation will be made of the reason why the present embodiment is high in breakdown voltage $V_R$, small in forward voltage drop $V_F$, and small in each of the parameters trr, $I_{rp}$, and $dI_r/dt$.

Figure 3:
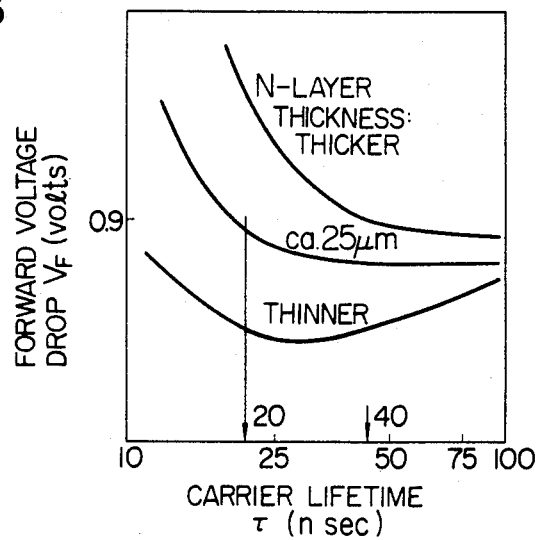
FIG. 3 is a graph showing relations between the carrier lifetime in diodes and the forward voltage drop thereof.

In order to make the breakdown voltage $V_R$ equal to or greater than 200 V, it is required that the N-layer 2 has an impurity concentration of $2 \times 10^{15}$ atoms/cc or less, that is, a resistivity of 2.5Ω-cm or more. Accordingly, the resistivity of the N-layer 2 is put in a range from 5 to 12Ω-cm, to grow the N-layer 2 without difficulty. Incidentally, even an N-layer having a resistivity of about 100Ω-cm can be used. The forward voltage drop $V_F$ depends upon the lifetime $\tau$ of carriers and the thickness $t_N$ of the N-layer 2. In the case where the thickness $t_N$ of the N-layer 2 exceeds 25 μm, the forward voltage drop $V_F$ was found to increase greatly as the carrier lifetime $\tau$ is smaller, as shown in FIG. 3. Accordingly, it is undesirable to make the thickness $t_N$ of the N-layer 2 greater than 25 μm. In the case where the thickness $t_N$ is less than 25 μm, the forward voltage drop $V_F$ decreased with decreasing carrier lifetime, till the forward voltage drop $V_F$ reaches a minimum value, and then increases with decreasing carrier lifetime. Accordingly, it is desirable to make the thickness $t_N$ smaller than 25 μm. While, in order to obtain a breakdown voltage of about 200 V, a depletion layer with a desired width has to be formed. That is, it is impossible to make the thickness $t_N$ extremely small. Accordingly, the lower limit of the thickness $t_N$ is 19 μm.

In order to make the reverse recovery time (trr) equal to or less than 50 nsec under conditions that a current twice as large as a rated forward current $I_F$ is forced to flow through the embodiment as shown in FIG. 2 and then attenuated at a rate of 25A/μsec, on the basis of the JEDEC specification, the carrier lifetime $\tau$ in the N-layer 2 is required to be equal to or less than 40 nsec, taking into consideration actual circuit conditions given to the embodiment. As shown in FIG. 3, in the case where the thickness $t_N$ of the N-layer 2 is relatively large, for example, about 25 μm, the forward voltage drop $V_F$ increases abruptly when the carrier lifetime $\tau$ becomes smaller than 20 nsec. Accordingly, a lower limit of the carrier lifetime $\tau$ is 20 nsec.

Further, in order to obtain a reverse recovery time (trr) of 50 nsec or less, it is required that the thickness of the P-layer 4, namely, the depth $x_j$ of the PN junction, is equal to or less than 6 μm. However, in order that the electrode 6 is uniformly put in ohmic contact with the P-layer 4 and a breakdown voltage of about 200 V is obtained, the depth $x_j$ has to be made equal to or greater than 2 μm.

Figure 4:
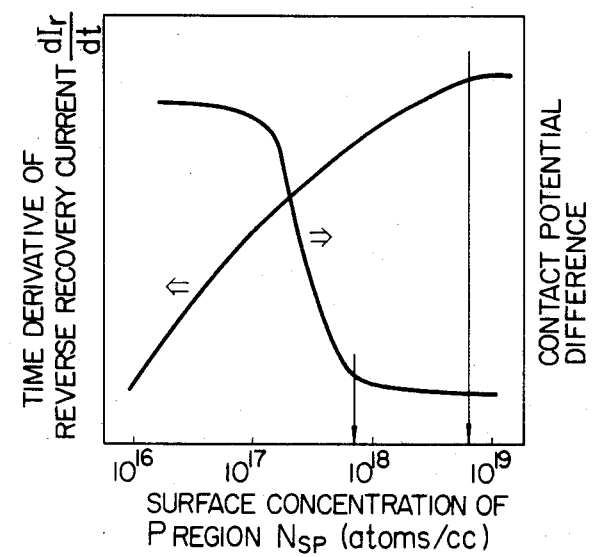
FIG. 4 is a graph showing a relation between the impurity concentration in the surface of P-layer and the derivative of reverse recovery current with respect to time.

FIG. 4 shows a relation between the surface impurity concentration $N_{SP}$ of the P-layer 4 and the parameter $dI_r/dt$, which is obtained under the above-explained restrictions on the resistivity and thickness of the N-layer 2, the carrier lifetime in the N-layer 2, and the thickness of the P-layer 4. As shown in FIG. 4, the time derivative of reverse recovery current $dI_r/dt$ decreases as the surface impurity concentration $N_{sp}$ is smaller, and a favorable, soft recovery characteristic is obtained when the surface impurity concentration $N_{sp}$ is equal to or less than $8 \times 10^{18}$ atoms/cc. However, the contact potential difference between the electrode 6 and P-layer 4 increases greatly when the surface impurity concentration $N_{sp}$ is made small, as shown in FIG. 4. Accordingly, the surface impurity concentration $N_{sp}$ cannot be made smaller than a value, which depends upon the material for forming the electrode 6. By the present inventor's investigation, it has been found that, in the case where the electrode 6 is made of an ordinary electrode material, the above-mentioned contact potential difference has a desired value when the surface impurity concentration $N_{sp}$ is made equal to or greater than $8 \times 10^{17}$ atoms/cc.

The embodiment shown in FIGS. 1a and 1b which satisfies the above-mentioned requirements with respect to the resistivity and thickness of the N-layer 2, the carrier lifetime in the N-layer 2, the thickness of the P-layer 4, and the surface impurity concentration of the P-layer 4, has a breakdown voltage $V_R$ of 200 V, a forward voltage drop $V_F$ of 0.9 V or less, a reverse recovery time (trr) of 50 nsec or less, and a soft recovery characteristic. Accordingly, a switching regulator including the present embodiment can operate at a high frequency. Further, even when a considerable time has elapsed, the breakdown voltage $V_R$ of the present embodiment is prevented from decreasing, by the action of the field plate electrode 6.

In the embodiment shown in FIGS. 1a and 1b, the $SiO_2$ film 5 may be replaced by one of various insulating films capable of serving as a passivation film such as an $Si_3N_4$ film, an $SiO_2$-$B_2O_3$-ZnO glass film, and a PbO-$SiO_2$-$B_2O_3$ glass film. Further, the contact electrode 7 may be put in ohmic contact with the N+-layer 1 without any intervening layer between the electrode 7 and the N+-layer 1.

We claim:

1. A high-speed diode comprising:
a semiconductor pellet including a P-layer, an N-layer, and an N+-layer so as to form a PNN+ structure, the impurity concentration in the surface of said P-layer being equal to or less than $8 \times 10^{18}$ atoms/cc and said P-layer having a thickness of 2 to 6 $\mu$m to provide a predetermined soft reverse recovery characteristic for the diode, said N-layer having a resistivity of 5$\Omega$-cm or more and a thickness of 19 to 25 $\mu$m, the carrier lifetime in said N-layer being in a range from 20 to 40 nanoseconds;
a first electrode kept in ohmic contact with said P-layer; and
a second electrode kept in ohmic contact with said N+-layer.

2. A high-speed diode according to claim 1, wherein said P-layer and said N-layer are exposed to one principal surface of said semiconductor pellet, a PN junction formed between said P-layer and N-layer terminates at said principal surface of said semiconductor pellet, said P-layer being surrounded with said N-layer at said principal surface, the terminus of said PN junction at said principal surface is coated with an insulating film, and said first electrode is extended on said insulating film so as to go beyond said terminus of said PN junction.

3. A high-speed diode according to claim 1, wherein said second electrode is bonded to said N+-layer through a semiconductor layer which has a conductivity of N-type and is larger in impurity concentration than said N+-layer.

4. A high-speed diode according to claim 1, wherein said N-layer has a resistivity of 5 to 100$\Omega$-cm.

5. A high-speed diode according to claim 1, wherein the impurity concentration in the surface of said P-layer lies in a range from $8 \times 10^{17}$ to $8 \times 10^{18}$ atoms/cc.

6. A high-speed diode according to claim 1, wherein said semiconductor pellet is doped with a heavy metal thereby adjusting the lifetime of the minority carrier in the N-layer in the range from 20 to 40 nanoseconds.

7. A high-speed diode according to claim 1, wherein said first electrode is formed of one of a single layer of aluminum, a four layer structure of Al-Cr-Ni-Ag, a three layer structure of Cr-Ni-Ag, and a three layer structure of Ti-Ni-Ag.

8. A high-speed diode according to claim 1, wherein said N-layer has a substantially uniform resistivity.

9. A high-speed diode comprising:
an n+-type low resistivity silicon substrate having mutually opposed first and second surfaces;
an n-type high resistivity layer epitaxially grown on said first surface of the substrate to form a third surface, having a substantially uniform resistivity of at least 5$\Omega$-cm and a thickness of 19 to 25 $\mu$m, and doped with lifetime killer to have a carrier lifetime of 20 to 40 nanoseconds;
a p-type region diffused from the second surface into said n-type high resistivity layer and having a surface impurity concentration of at most $8 \times 10^{18}$ atoms/cc and a thickness of 2 to 6 $\mu$m to thereby provide a predetermined soft reverse recovery characteristic for the diode;
an n++-type region formed in the second surface of the substrate and having a much higher surface impurity concentration than that of the p-type region;
a cathode electrode formed on said n++-type region; and
an anode electrode formed on said p-type region.

10. A high-speed diode according to claim 9, wherein said impurity concentration of the p-type region is at least $8 \times 10^{17}$ atoms/cc to thereby suppress a contact potential difference of said anode electrode and said p-type region.

11. A high-speed diode according to claim 10, wherein said substrate is doped with antimony.

* * * * *